US011417986B2

(12) United States Patent
Plazio et al.

(10) Patent No.: US 11,417,986 B2
(45) Date of Patent: Aug. 16, 2022

(54) ELECTRICAL CONNECTOR GROUP PROVIDED WITH INTEGRATED VENT VALVE AND RELATED MAKING AND ASSEMBLING METHOD, IN PARTICULAR IN THE AUTOMOTIVE FIELD

(71) Applicant: MARELLI EUROPE S.p.A., Corbetta (IT)

(72) Inventors: Adriano Plazio, Corbetta (IT); Razvan-Vasile Deji, Corbetta (IT); Davide Maggioni, Corbetta (IT)

(73) Assignee: MARELLI EUROPE S.p.A., Corbetta (IT)

( * ) Notice: Subject to any disclaimer, the term of this patent is extended or adjusted under 35 U.S.C. 154(b) by 0 days.

(21) Appl. No.: 17/330,844

(22) Filed: May 26, 2021

(65) Prior Publication Data

US 2022/0006231 A1    Jan. 6, 2022

(30) Foreign Application Priority Data

Jul. 2, 2020 (IT) .................. 102020000016015

(51) Int. Cl.
*H01R 13/518* (2006.01)
*H01R 13/52* (2006.01)
*H01R 43/00* (2006.01)

(52) U.S. Cl.
CPC ....... *H01R 13/5227* (2013.01); *H01R 13/518* (2013.01); *H01R 13/5213* (2013.01); *H01R 43/005* (2013.01)

(58) Field of Classification Search
CPC ............. H01R 13/5227; H01R 13/518; H01R 13/5213; H01R 43/005
See application file for complete search history.

(56) References Cited

U.S. PATENT DOCUMENTS 11,101,597 B1* 8/2021 Pinol Pedret ........ H05K 5/0213
2014/0065877 A1* 3/2014 Ohhashi ............... H05K 5/0052
439/519

(Continued)

FOREIGN PATENT DOCUMENTS

DE   102013220543 A1   4/2014
JP   2016201319 A      12/2016

OTHER PUBLICATIONS

Search Report for Italian Patent Application No. 202000016015 dated Mar. 5, 2021.

*Primary Examiner* — Tho D Ta
(74) *Attorney, Agent, or Firm* — Howard & Howard Attorneys PLLC

(57) ABSTRACT

An electrical connector group comprising a connector body shaped to allow electrical connection with external components. The connector body delimits an inner volume. A plurality of electrical contacts are housed in the inner volume and connected to the connector body and to at least one internal electrical/electronic circuit or component. At least one closing lid of the connector body covers and hermetically seals the inner volume. At least one vent valve is fluidically connected to the inner volume, so as to allow only the exit of fluids from the inner volume to the outside. The vent valve comprises a valve head, integral with the connector body and coupled with a seat of the closing lid using a shape coupling, in order to perform a fixing and a centering of the closing lid with respect to the connector body.

17 Claims, 6 Drawing Sheets

(56) References Cited

U.S. PATENT DOCUMENTS

| | | |
|---|---|---|
| 2018/0351273 A1 | 12/2018 | Volpin et al. |
| 2019/0124779 A1* | 4/2019 | Okumura ............. H05K 5/0069 |
| 2020/0076139 A1* | 3/2020 | Lehnert ............. H01R 13/5219 |
| 2021/0265762 A1* | 8/2021 | Plazio ................. H01R 12/724 |

* cited by examiner

ELECTRICAL CONNECTOR GROUP PROVIDED WITH INTEGRATED VENT VALVE AND RELATED MAKING AND ASSEMBLING METHOD, IN PARTICULAR IN THE AUTOMOTIVE FIELD

CROSS-REFERENCE TO RELATED APPLICATIONS

The present application claims priority to and all the benefits of Italian Patent Application No. 102020000016015, filed on Jul. 2, 2020, which is hereby expressly incorporated herein by reference in its entirety.

BACKGROUND OF THE INVENTION

1. Field of the Invention

The present invention relates to an electrical connector group provided with an integrated vent valve and related making and assembling method, in particular in the automotive field.

2. Description of the Related Art

In the automotive field, it is known to produce electrical connectors which have the function of electrically connecting electrical and/or electronic components of the electrical system on board the vehicle.

Typically, said electrical connectors are used to connect one or more on-board control units, used for the control and management of various functions of the vehicle components.

The connectors typically comprise a connector body, electrical contacts (typically electrical fins) and a cover or covering lid.

Since the electrical components and the related contacts must be protected from the entry of liquids from the outside, the connector body and the related cover or covering lid are hermetically sealed.

Obviously, the inner volume enclosed by the electrical connector group requires a vent valve, of the one-way type, which prevents the entry of liquids from the outside and which, at the same time, allows the exit of gases or internal fluids, so as to ensure the control of the correct pressure inside the environment of the connector, of the contacts and of the related electrical and/or electronic component connected thereto.

The known solutions include positioning said vent valve at one end of the outer casing of the electrical connector, so as to allow the control of the internal pressure.

However, such known solutions have some drawbacks and disadvantages.

In particular, the positioning of the vent valve included in the known solutions entails an overall increase in the dimensions of the electrical connector which is absolutely not negligible.

Furthermore, the known solutions include that the vent valve is in turn subject to the direct action of external agents, such as liquids, dust, dirt in general, but also impacts, for example during normal maintenance operations inside the engine compartment.

Although the vent valve is used as a barrier to said atmospheric agents, and therefore designed to resist them, excessive exposure or poor protection of the vent valve can compromise the correct operation thereof over time.

Furthermore, as seen, the vent valves of the known solutions, due to the cantilevered position thereof with respect to the outer casing of the electrical connector, end up increasing the overall dimensions thereof. Unfortunately, the increase in dimensions is often a large problem for designers, both in terms of the location of the various electrical and electronic components inside the engine compartment, and in terms of the difficult access for maintenance technicians to the surrounding members and components.

A further technical problem connected to the solutions of the known art is also linked to the overall assembly times of the electrical connector group, since these are small components which require particularly delicate and complex assemblies to be carried out on the assembly line. The assembly of the vent valve entails a further increase in difficulties, times and, consequently, the overall costs of assembling the components.

SUMMARY OF THE INVENTION

Therefore, the need to solve the drawbacks and limitations cited with reference to the known art is felt.

Such a need is satisfied by an electrical connector group comprising a connector body shaped to allow electrical connection with components external to the electrical connector. The connector body delimits at least partially an inner volume. A plurality of electrical contacts are housed in the inner volume and connected, at a first end, to the connector body, to allow the electrical connection with the external components and, at a second end, to at least one electrical/electronic circuit or component inside the electrical connector group. At least one closing lid covers the connector body and hermetically seals the inner volume. At least one vent valve is fluidically connected with the inner volume. The vent valve is of the one-way type, so as to allow only the exit of fluids from the inner volume to outside the inner volume of the electrical connector group. The vent valve includes a valve head which is integral with the connector body and is coupled with a seat of the closing lid by a shape coupling, in order to realize a fixing and centering of the closing lid with respect to the connector body.

The present invention is also directed toward a related method of making and assembling an electrical connector group comprising the steps of providing a connector body shaped to allow electrical connection with components external to the electrical connector group. The connector body delimits, at least partially, an inner volume. The method also includes the steps of providing a plurality of electrical contacts, providing at least one closing lid of the connector body with a seat, providing at least one vent valve which comprises a valve head and co-moulding it with the connector body. The vent valve is fluidically connected with the inner volume, and is of the one-way type, so as to allow only the exit of fluids from the inner volume to outside the inner volume of the electrical connector group. The method further includes the steps of placing the electrical connectors in the inner volume, the electrical connectors being connected, at a first end, to the connector body, to allow the electrical connection with external components and, at a second end, to at least one electrical/electronic circuit or component inside the electrical connector group, coupling the valve head with said seat of the closing lid using a shape coupling so as to realize a fixing and a centering of the closing lid with respect to the connector body, and covering the connector body with the closing lid and hermetically sealing said inner volume.

BRIEF DESCRIPTION OF THE DRAWINGS

Further features and advantages of the present invention will become more understandable from the following description of preferred and non-limiting embodiments thereof, in which.

Elements or parts in common to the embodiments described will be indicated hereafter using the same reference numerals.

DETAILED DESCRIPTION OF THE INVENTION

Figure 1:
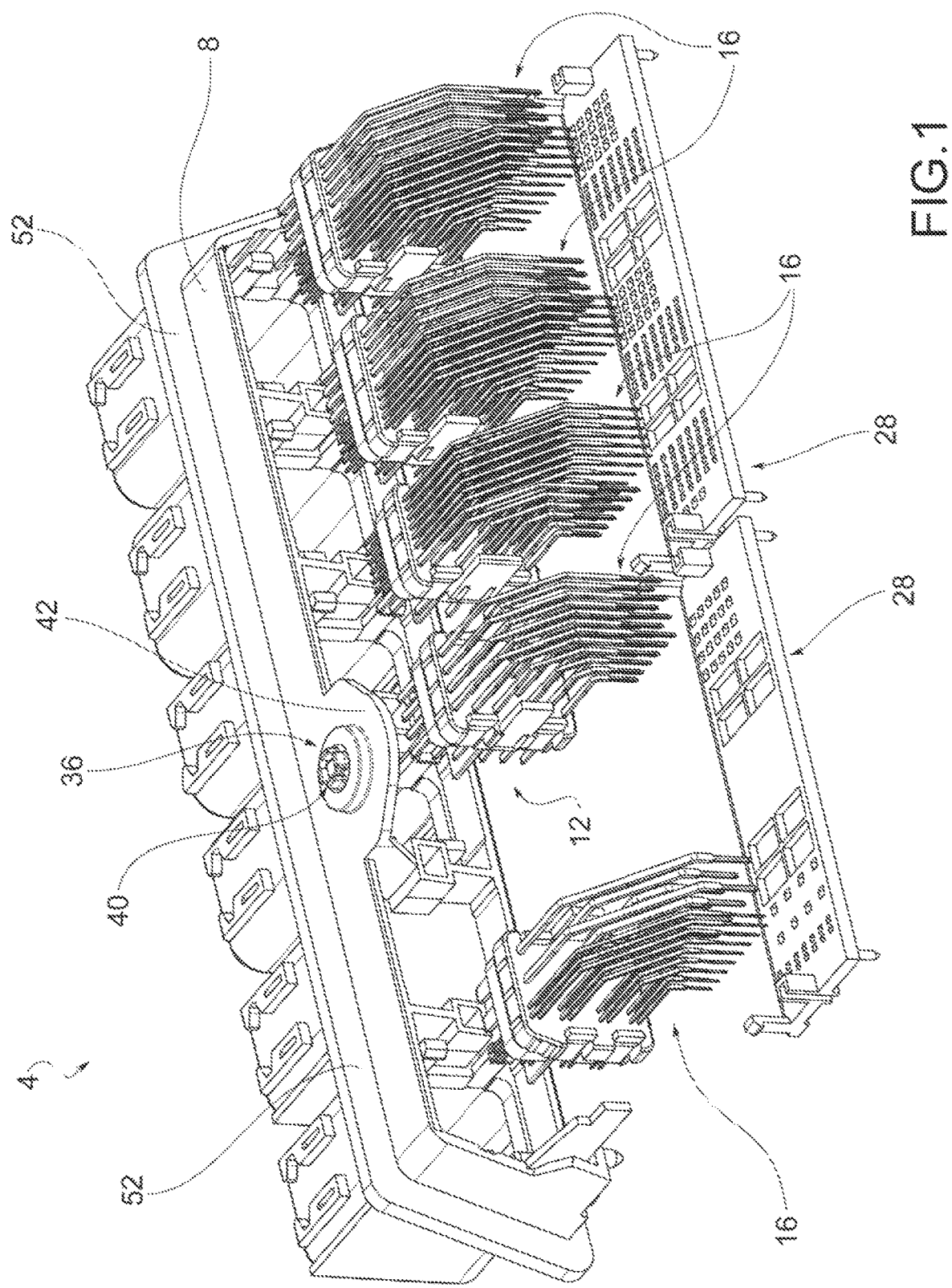
FIG. 1 depicts an exploded perspective view of an electrical connector group according to an embodiment of the present invention.
Figure 2:
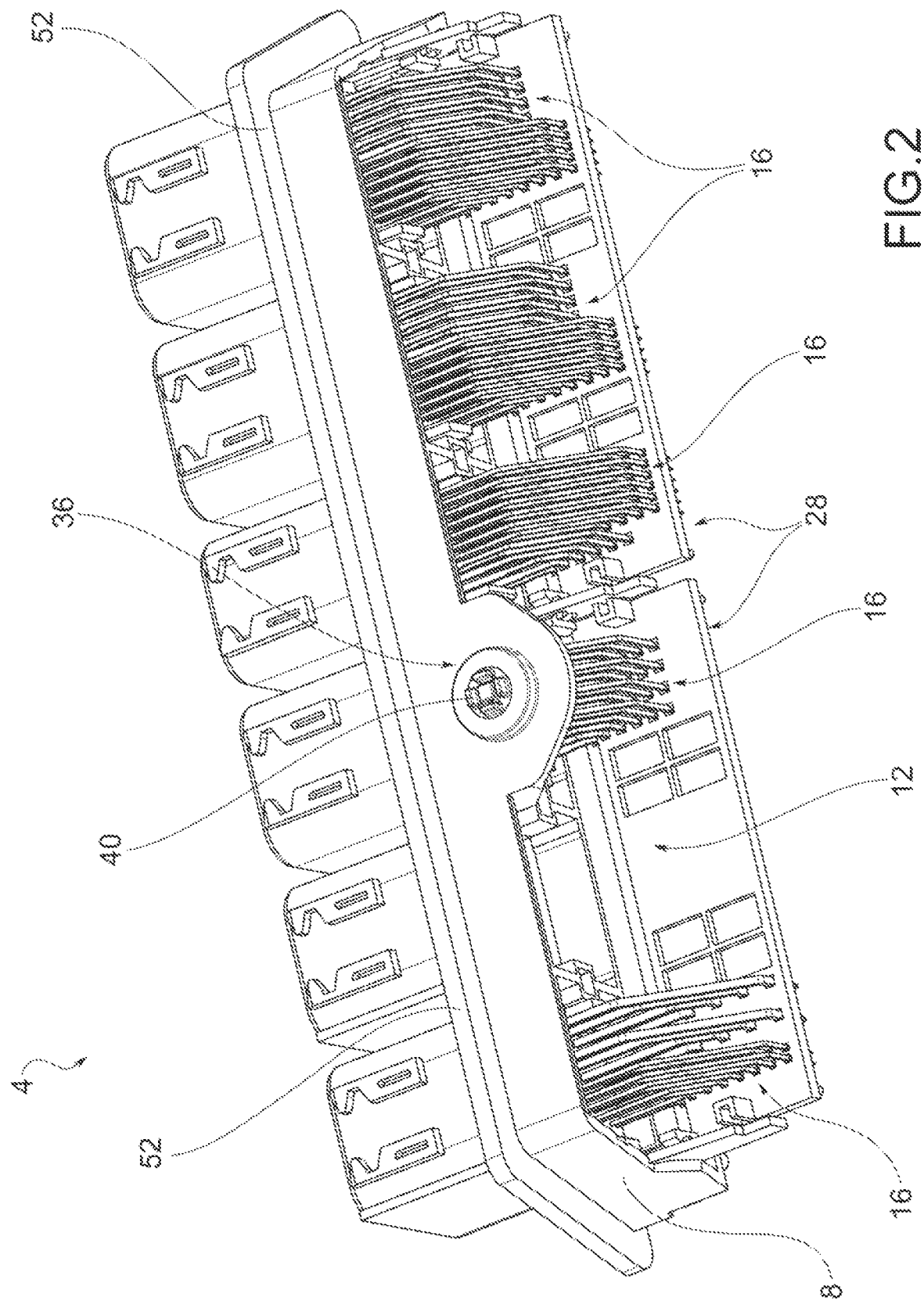
FIG. 2 depicts a perspective view, in partial assembly configuration, of the electrical connector group of FIG. 1.
Figure 3:
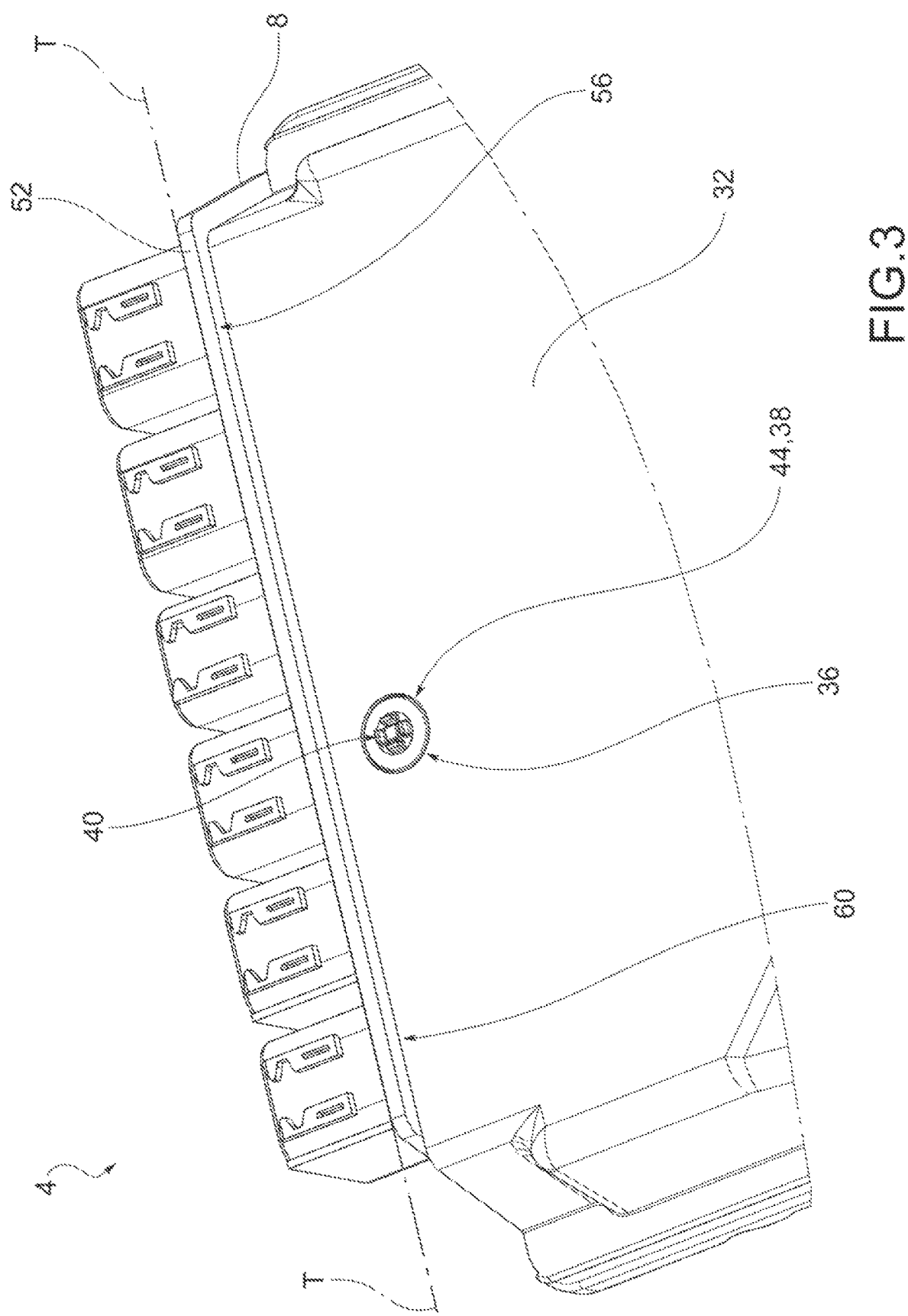
FIG. 3 depicts a perspective view, in assembly configuration, of the electrical connector group of FIG. 1.
Figure 4:
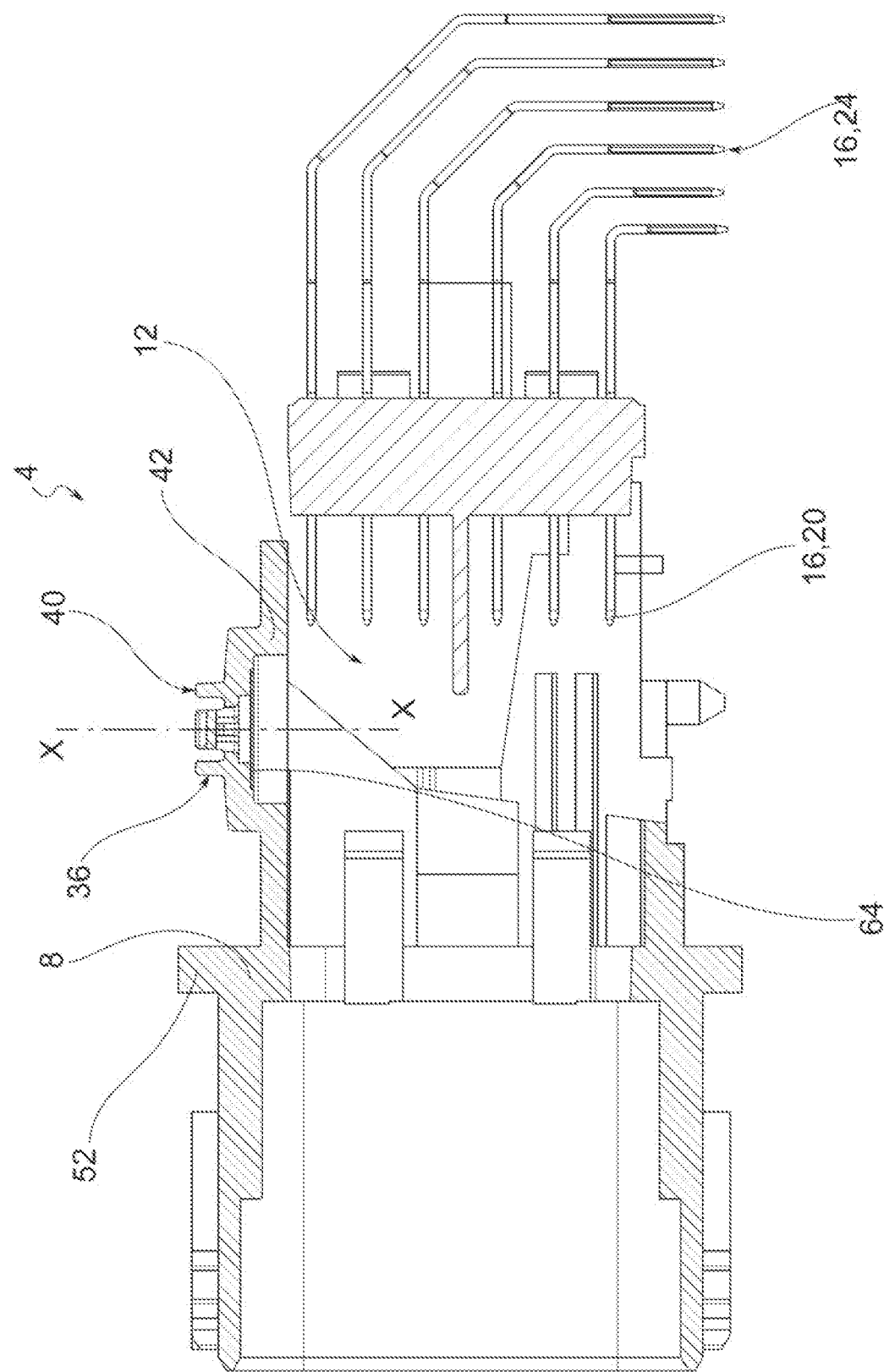
FIG. 4 depicts a sectional view, in exploded configuration, of the electrical connector group of FIG. 1.
Figure 5:
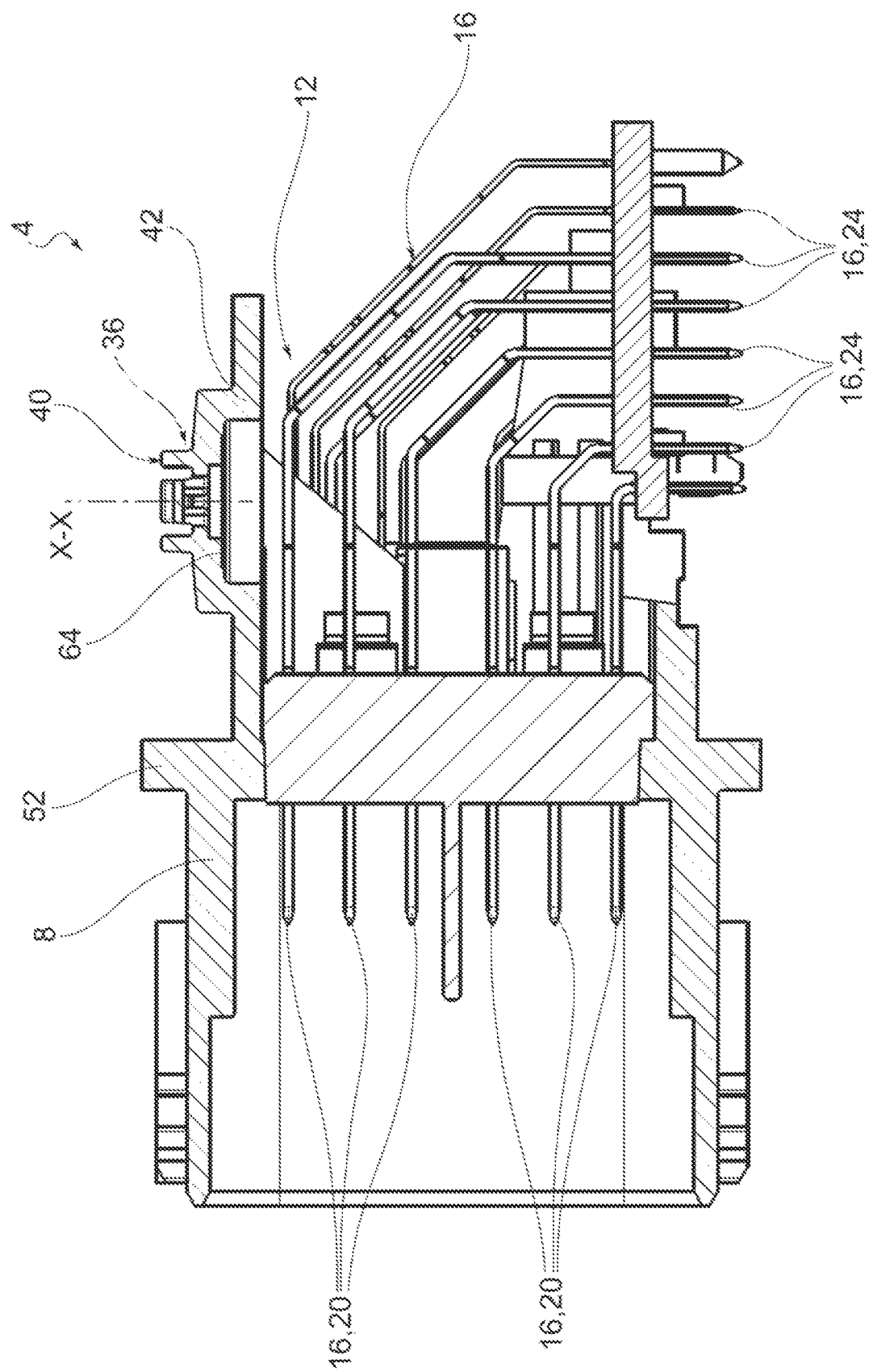
FIG. 5 depicts a sectional view, in partial assembly configuration, of the electrical connector group of FIG. 2.
Figure 6:
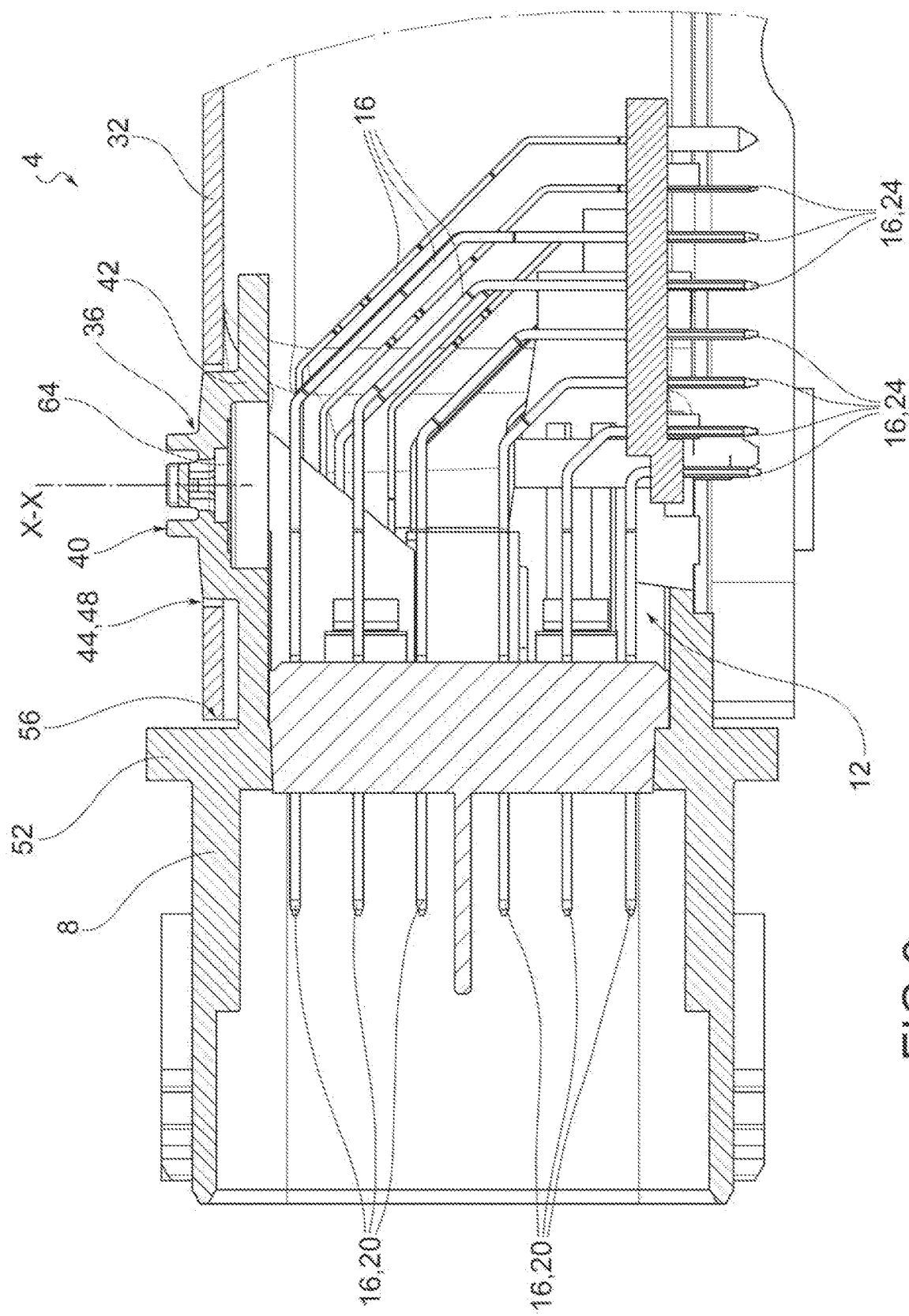
FIG. 6 depicts a sectional view, in assembly configuration, of the electrical connector group of FIG. 3.

With reference to the aforementioned drawings, reference numeral 4 globally indicates an electrical connector group, in particular for the automotive field.

It should be noted that the application of the present invention to the automotive field is preferential, but not exclusive, since the solution can be applied to any type of connector.

Likewise, it should be noted that the present solution applies to any type of vehicle in the broad sense; in other words, the present invention finds easy application in any type of vehicle provided with an internal combustion engine, powered by any type of fuel, but also in any hybrid or fully electric powered vehicle.

The electrical connector group 4 comprises a connector body 8 shaped to allow electrical connection with components external to the electrical connector 4 itself.

The connector body 8 can be made of any material, preferably of polymeric material, and is obtained by moulding.

The connector body can be of the modular type, for example.

The connector body 8 internally delimits, at least partially, an inner volume 12. The inner volume 12 houses further components of the electrical connector 4 or connected thereto.

In particular, the electrical connector 4 comprises a plurality of electrical contacts 16, typically metal pins, housed in the inner volume 12 and connected, at a first end 20, to the connector body 8, to allow the electrical connection with the external components and, at a second end 24, to at least one electrical/electronic circuit or component 28 inside the electrical connector 4. In particular, at least one electrical/electronic circuit or component 28 is housed in the inner volume 12.

In accordance with a possible embodiment, the electrical contacts 16 are curved or bent by about 90°: typically the first end 20 and second end 24 are perpendicular to each other. Such a geometric arrangement of the electrical contacts 16 is however only indicative and not mandatory for the purposes of the present invention.

The electrical connector group 4 further comprises at least one closing lid 32 covering the connector body 8 and hermetically sealing the inner volume 12.

It should be noted that the closing lid 32 can in turn be made of one or more parts/components, all shaped so as to delimit the inner volume 12 in a sealed manner.

The closing lid 32, whether in one piece or in several parts, is normally made of aluminium alloy, but can also be made of plastic material.

In particular, the inner volume 12 must be hermetically sealed to prevent any access therein of dirt, gases, liquids of any kind which could compromise the operation of the electrical/electronic circuit or component 28 contained therein.

The hermetic seal of the inner volume 12, as better described below, is obtained by co-moulding and/or gluing (or even the use, for example, of sealants such as silicones) of the closing lid 32 with the connector body 8.

As seen, the creation of a hermetically sealed inner volume 12 implies the technical problem of ensuring pressure control inside the inner volume 12 itself, so as to preserve the correct operation of the electrical/electronic circuits or components 28 contained therein.

For this purpose, the electrical connector group 4 comprises at least one vent valve 36 fluidically connected to the inner volume 12, being of the one-way type, so as to allow only the exit of fluids (whether liquids or gases) from the inner volume 12 to outside the inner volume 12 of the electrical connector group 4.

Therefore, the vent valve 36 intercepts the inner volume 12 and allows the exit of fluids to the outside so as to ensure the correct internal pressure, which could vary, depending on the temperature of the environment where the electrical connector group 4 is placed. In this regard, it should be recalled that such a temperature, inside an engine compartment, can vary even by several tens of degrees centigrade, during the life and normal operation of the corresponding vehicle.

The vent valve 36 can be of various shapes, sizes, types and materials, in a manner known in the technical field.

In accordance with a possible embodiment, the vent valve 36 comprises a valve head 40 which is integral with the connector body 8 and is coupled with a seat 44 of the closing lid 32 using a shape coupling, in order to perform a fixing and a centering of the closing lid 32 with respect to the connector body 8.

Preferably, the valve head 40 is integral with a special base plate 42 made on the connector body 8 to support the vent valve 36.

In other words, the connector body 8 includes a specific appendage or offshoot in the form of a base plate 42, which has the specific function of supporting the vent valve 36, so that it is integral with the closing lid 32.

The vent valve 36 further comprises, for example, an inner membrane 64 which allows to obtain the one-way direction of the exit of fluids from the inside to the outside.

In one embodiment, the vent valve 36 is co-moulded with the connector body 8.

In accordance with a possible embodiment, the valve head 40 is at least partially embedded in and/or surrounded by the seat 44 of the closing lid 32.

For example, the seat 44 of the closing lid 32 comprises a hole 48 which houses at least partially the valve head 40, in order to perform the shape coupling.

The hole 48 is preferably open or through, so as to be crossed by the valve head 40 which can therefore, if necessary, discharge fluids to the outside of the inner volume 12.

It is also possible to include the use of a blind hole 48, but provided, for example in a lateral or in any case retracted position, with at least one opening for expelling the fluids to the outside of the inner volume 12.

The shape coupling between the connector body 8 and the seat 44 of the closing lid 32 acts to create a constraint to the mutual translation of the closing lid 32 and the connector body 8 on a coupling plane perpendicular to a vent axis X-X of the vent valve 36. In other words, following the shape coupling between the connector body 8 and the seat 44, the closing lid 32 can no longer translate with respect to the connector body 8. Therefore, the shape coupling performs a real mechanical fixing between said two components.

In accordance with a possible embodiment, the shape coupling between the connector body 8 and the seat 44 of the closing lid 32 acts to create a constraint to the mutual rotation of the closing lid 32 and the connector body 8 on a coupling plane perpendicular to a vent axis X-X of the vent valve 36.

In other words, the vent valve 36 assumes the function of a real mutual positioning and fixing pin between the closing lid 32 and the connector body 8. This additional function is completely innovative with respect to the solutions of the known art in which the vent valve forms a mere appendage with respect to the connector body 8. On the other hand, in accordance with the present invention, the vent valve 36 performs not only the classic function of controlling the pressure inside the inner volume 12, but also the innovative function of positioning and fixing the closing lid 32 on the connector body 8.

In accordance with a possible embodiment, the connector body 8 comprises a shoulder or prominence 52 which constitutes an abutment for the closing lid 32. In a possible alternative embodiment, once fitted on the connector body 8, an edge 56 of the closing lid 32 abuts against the shoulder or prominence 52. In other embodiments, there is instead a clearance between the edge 56 of the closing lid 32 and the shoulder or prominence 52.

According to a possible embodiment, the shoulder or prominence 52, the closing lid 32, the vent valve 36 and the seat 44 of the closing lid 32 are configured and sized so that the abutment of the edge 56 of the closing lid 32 against the shoulder or prominence 52 occurs at the same time as the engagement or shape coupling of the vent valve 36 and the seat 44. In this case, a synergy is achieved between the shoulder or prominence 52 and the vent valve 36, in the mutual positioning of the closing lid 32 and the connector body 8.

In accordance with a possible embodiment, the shoulder or prominence 52 has a height greater than or equal to the height of the valve head 40, the heights being measured perpendicular to the base plate 42 of the connector body 8 supporting the vent valve 36. Thereby, the shoulder or prominence 52 forms a further barrier against possible impacts which may accidentally occur against the valve head 40, for example during normal maintenance operations.

The valve head 40 can have various shapes, sizes and geometries.

In accordance with a possible embodiment, the valve head 40 has a circular cross-section with respect to a plane perpendicular to a vent axis X-X of the vent valve 36, in which the seat 44 is counter-shaped with respect to the valve head 40 itself.

In accordance with a further possible embodiment, the valve head 40 has a non-axial-symmetric cross-section with respect to a plane perpendicular to a vent axis X-X of the vent valve 36, in which the seat 44 is counter-shaped with respect to the valve head 40 itself.

As mentioned above, the electrical connector group 4 comprises a plurality of electrical contacts 16, typically metal pins.

For example, the electrical contacts 16 extend side by side along a prevailing transverse direction T-T defining a major side 60 of the connector body 8. In one embodiment, the vent valve 36 and the seat 44 of the closing lid 32 are positioned along the major side 60 of the connector body 8.

The method of making and assembling an electrical connector group provided with a vent valve in accordance with the present invention will now be described.

In particular, it begins with the step of providing a connector body 8 shaped to allow the electrical connection with components external to the electrical connector group 4 itself, with the connector body delimiting at least partially an inner volume 12. Typically, the connector body 8 is made by moulding plastic material.

A plurality of electrical contacts 16 are provided, which initially are not folded, but in one embodiment, are straight.

The method then continues by providing at least one closing lid 32 of the connector body 8, provided with a seat 44. The closing lid 32 may also be obtained by moulding plastic material.

At least one vent valve 36 is provided which comprises a valve head 40, which may be co-moulded with the connector body 8, for example at a specific base plate 42, designed to support the vent valve 36.

As seen, the vent valve 36 is fluidly connected with the inner volume 12, and is of the one-way type, so as to allow only the exit of fluids from the inner volume 12 to outside the inner volume of the electrical connector group 4.

The electrical contacts 16 are then placed in the inner volume 12, in which the electrical contacts 16 are connected, at the first end 20, to the connector body 8, to allow the electrical connection with external components and, at the second end 24, to at least one electrical/electronic circuit or component 28 inside the electrical connector group 4.

The step follows of coupling the valve head 40 with the seat 44 of the closing lid 32 using a shape coupling, so as to perform a fixing and positioning/centering of the closing lid 32 with respect to the connector body 8.

The shoulder or prominence 52, if provided, will collaborate synergistically to ensure the correct mutual positioning, at the end-of-stroke, of the closing lid 32 and the connector body 8.

The method then ends with the step of covering the connector body 8 with the closing lid 32 and of hermetically sealing the inner volume 12.

Such a hermetic seal is, for example, performed by adding adhesives and/or sealants. The mechanical or shape coupling of the seat 44 of the closing lid 32 and the vent valve 36 of the connector body 8 ensures that there are no mutual movements between the closing lid 32 and the connector body 8 during the hardening step of said adhesives and/or sealants.

Therefore, the step of gluing and/or sealing the closing lid 32 on the connector body 8 is realized after the step of shape coupling the head 40 of the vent valve 36 and the seat 44 of the closing lid 32.

In one embodiment, the method of making an electrical connector group 4 according to the present invention comprises the step of preparing and gluing or welding an inner membrane 64 of the vent valve 36 in the valve head 40, before the step of placing the electrical contacts or metal pins 16 in said inner volume 12 and before sealing the inner volume.

As can be appreciated from the description above, the present invention overcomes the drawbacks presented in the prior art.

In particular, the electrical connector group does not have additional dimensions due to the presence of the vent valve, since the latter is integrated with the outer cover of the connector itself.

In other words, the vent valve is integrated in the connector without compromising the overall dimensions of the latter.

At the same time, the vent valve is protected from the external environment, in particular both against dirt and against possible impacts, for example during normal maintenance operations.

Furthermore, the process of making and assembling the electrical connector group in accordance with the present invention is particularly easy and fast, since the step of centering the outer cover on the connector body is simplified.

In other words, the pre-placement and the centering of the cover or lid with respect to the connector body is ensured during the assembly step on the assembly line.

In a completely innovative manner, the vent valve of the present invention no longer forms an additional element with respect to the connector body and the lid but, on the contrary, forms an integrated element of the connector which performs a specific and new function of centering and pre-assembly between the outer cover and the connector body.

The vent valve of the present invention also adds to the classic function of regulating the pressure inside the connector the innovative function of supporting and simplifying the assembly step of the connector as a whole.

The vent valve assumes the function of a real pin for placing and mutually fixing the closing lid and the connector body, in addition to the standard function of controlling the pressure inside the inner volume.

The electrical connector group according to the present invention acts to solve the problems of overall dimensions, reliability, times and assembly costs typical of the solutions of the connectors of the known art.

The invention has been described in an illustrative manner. It is to be understood that the terminology which has been used is intended to be in the nature of words of description rather than of limitation. Many modifications and variations of the invention are possible in light of the above teachings. Therefore, within the scope of the appended claims, the invention may be practiced other than as specifically described.

The invention claimed is:

1. An electrical connector group comprising:
   a connector body shaped to allow electrical connection with components external to the electrical connector, said connector body delimiting at least partially an inner volume,
   a plurality of electrical contacts housed in said inner volume and connected, at a first end, to the connector body, to allow the electrical connection with said external components and, at a second end, to at least one electrical/electronic circuit or component inside the electrical connector group,
   at least one closing lid covering said connector body and hermetically sealing said inner volume, and
   at least one vent valve fluidically connected with said inner volume, being of the one-way type, so as to allow only the exit of fluids from the inner volume to outside the inner volume of the electrical connector group,
   wherein the vent valve comprises a valve head which is integral with the connector body and is coupled with a seat of said closing lid by a shape coupling, in order to realize a fixing and centering of the closing lid with respect to the connector body.

2. The electrical connector group as set forth in claim 1, wherein the valve head is at least partially embedded in and/or surrounded by the seat of the closing lid.

3. The electrical connector group as set forth in claim 1, wherein the seat of the closing lid comprises a hole that houses at least partially the valve head, in order to realize said shape coupling.

4. The electrical connector group as set forth in claim 1, wherein the shape coupling between the connector body and the seat of the closing lid acts to create a constraint to the mutual translation of the closing lid and the connector body on a coupling plane perpendicular to a vent axis of the vent valve.

5. The electrical connector group as set forth in claim 1, wherein the shape coupling between the connector body and the seat of the closing lid acts to create a constraint to the mutual rotation of the closing lid and the connector body on a coupling plane perpendicular to a vent axis of the vent valve.

6. The electrical connector group as set forth in claim 1, wherein the valve head is integral with a dedicated base plate made on the connector body to support said vent valve.

7. The electrical connector group as set forth in claim 1, wherein the connector body comprises a shoulder or prominence which constitutes an abutment for an edge of the closing lid.

8. The electrical connector group as set forth in claim 7, wherein said shoulder or prominence has a height greater than or equal to the height of the valve head, said heights being measured perpendicular to a base plate of the connector body supporting the vent valve.

9. The electrical connector group as set forth in claim 7, wherein the shoulder or prominence, the closing lid, the vent valve and the seat of the closing lid are configured and sized so that the abutment of the edge of the closing lid against the shoulder or prominence occurs at the same time as the engagement or shape coupling of the vent valve and the seat.

10. The electrical connector group as set forth in claim 1, wherein the valve head has a circular cross-section with respect to a plane perpendicular to a vent axis of the vent valve, wherein the seat is counter-shaped to the valve head.

11. The electrical connector group as set forth in claim 1, wherein the valve head has a non-axial-symmetric cross section with respect to a cross-section plane perpendicular to a vent axis of the vent valve, wherein the seat is counter-shaped to the valve head.

12. The electrical connector group as set forth in claim 1, wherein said vent valve is co-moulded with the connector body.

13. The electrical connector group as set forth in claim 1, wherein the connector comprises a plurality of electrical contacts extending side by side along a prevailing transverse direction defining a major side of the connector body, and wherein said vent valve and said seat of the closing lid are positioned along said major side of the connector body.

14. A method of making and assembling an electrical connector group, comprising the steps of:

providing a connector body shaped to allow electrical connection with components external to the electrical connector group, said connector body delimiting at least partially an inner volume, providing a plurality of electrical contacts, providing at least one closing lid of the connector body with a seat, providing at least one vent valve which comprises a valve head and co-moulding it with the connector body, the vent valve being fluidically connected with said inner volume, and being of the one-way type, so as to allow only the exit of fluids from the inner volume to outside the inner volume of the electrical connector group, placing the electrical connectors in said inner volume, the electrical connectors being connected, at a first end, to the connector body, to allow the electrical connection with external components and, at a second end, to at least one electrical/electronic circuit or component inside the electrical connector group, coupling the valve head with said seat of the closing lid using a shape coupling so as to realize a fixing and a centering of the closing lid with respect to the connector body, and covering the connector body with the closing lid and hermetically sealing said inner volume.

15. The method of making and assembling an electrical connector group as set forth in claim 14, comprising the step of providing and gluing or welding an inner membrane of the vent valve in said valve head, before the step of placing electrical contacts or metal pins in said inner volume and before sealing the inner volume.

16. The method of making and assembling an electrical connector group as set forth in claim 14, comprising the steps of:

gluing and/or sealing the closing lid onto the connector body after the shape coupling step of the head of the vent valve and the seat of the closing lid.

17. The method of making and assembling an electrical connector group as set forth in claim 14, wherein the electrical connector group includes:

a connector body shaped to allow electrical connection with components external to the electrical connector, said connector body delimiting at least partially an inner volume, a plurality of electrical contacts housed in said inner volume and connected, at a first end, to the connector body, to allow the electrical connection with said external components and, at a second end, to at least one electrical/electronic circuit or component inside the electrical connector group, at least one closing lid covering said connector body and hermetically sealing said inner volume, and at least one vent valve fluidically connected with said inner volume, being of the one-way type, so as to allow only the exit of fluids from the inner volume to outside the inner volume of the electrical connector group, wherein the vent valve comprises a valve head which is integral with the connector body and is coupled with a seat of said closing lid by a shape coupling, in order to realize a fixing and centering of the closing lid with respect to the connector body.

\* \* \* \* \*